United States Patent
Chang et al.

(10) Patent No.: US 11,259,436 B2
(45) Date of Patent: Feb. 22, 2022

(54) INFORMATION HANDLING SYSTEM WITH A BATTERY TAB MECHANISM TO OPTIMIZE BATTERY FLEXIBILITY

(71) Applicant: DELL PRODUCTS, LP, Round Rock, TX (US)

(72) Inventors: Yao-Tsung Chang, Taipei (TW); Chia-Min Sun, Taipei (TW)

(73) Assignee: Dell Products L.P., Round Rock, TX (US)

( * ) Notice: Subject to any disclaimer, the term of this patent is extended or adjusted under 35 U.S.C. 154(b) by 5 days.

(21) Appl. No.: 16/887,655

(22) Filed: May 29, 2020

(65) Prior Publication Data
US 2021/0378123 A1 Dec. 2, 2021

(51) Int. Cl.
*H05K 5/00* (2006.01)
*H05K 7/14* (2006.01)
*H05K 5/02* (2006.01)

(52) U.S. Cl.
CPC ......... *H05K 7/1487* (2013.01); *H05K 5/0286* (2013.01); *H05K 7/1405* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 5,670,267 A * | 9/1997 | Lee | H01M 50/213 429/9 |
| 6,357,534 B1 | 3/2002 | Buetow et al. | |
| 6,501,644 B1 * | 12/2002 | Silverman | G06F 1/1613 248/560 |
| 7,236,356 B2 * | 6/2007 | Ulla | G06F 1/1626 361/679.21 |
| 7,859,836 B2 * | 12/2010 | Bae | G06F 1/1632 361/679.55 |
| 9,786,881 B2 * | 10/2017 | Tazawa | H01M 50/20 |
| 10,198,037 B2 * | 2/2019 | Belfiglio | G06F 1/187 |
| 10,613,583 B2 * | 4/2020 | Chang | H01M 50/209 |
| 10,976,783 B2 * | 4/2021 | Belfiglio | G06F 1/1656 |
| 2005/0213297 A1 * | 9/2005 | Ulla | G06F 1/1632 361/679.33 |
| 2009/0052130 A1 * | 2/2009 | Hsieh | G06F 1/187 361/679.31 |
| 2010/0091444 A1 * | 4/2010 | Reid | G06F 1/1658 361/679.37 |
| 2016/0353593 A1 * | 12/2016 | Park | F16B 5/065 |
| 2019/0204869 A1 | 7/2019 | Chang et al. | |

* cited by examiner

*Primary Examiner* — Anthony Q Edwards
*Assistant Examiner* — Rashen E Morrison
(74) *Attorney, Agent, or Firm* — Larson Newman, LLP

(57) ABSTRACT

A system includes a chassis assembly, a snap holder secured to the chassis assembly, and a second snap holder secured to the chassis assembly. A first tab clip may be snap-fitted onto the first snap holder to secure the first tab clip to the first snap holder, and a second tab clip may be snap-fitted onto the first snap holder to secure the second tab clip to the second snap holder. Each tab clip includes a soft component portion within the tab clip. A battery may be affixed to the first and second tab clips after the tab clips are secured to the snap holders.

18 Claims, 8 Drawing Sheets

US 11,259,436 B2

INFORMATION HANDLING SYSTEM WITH A BATTERY TAB MECHANISM TO OPTIMIZE BATTERY FLEXIBILITY

FIELD OF THE DISCLOSURE

This disclosure generally relates to information handling systems, and more particularly relates to an information handling system with a battery tab mechanism to optimize battery flexibility.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A system includes a chassis assembly, a snap holder secured to the chassis assembly, and a second snap holder secured to the chassis assembly. A first tab clip is snap-fitted onto the first snap holder to secure the first tab clip to the first snap holder, and a second tab clip is snap-fitted onto the first snap holder to secure the second tab clip to the second snap holder. Each tab clip includes a soft component portion within the tab clip. A battery is affixed to the first and second tab clips after the tab clips are secured to the snap holders.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings may certainly be used in this application. The teachings may also be used in other applications, and with several different types of architectures, such as distributed computing architectures, client/server architectures, or middleware server architectures and associated resources.

Mobile information handling systems typically include a rechargeable battery to provide power to the system when main power is unavailable. The battery, often referred to as a battery pack, may include more than one individual cells that are housed in a plastic enclosure. The battery enclosure typically includes mounting tabs to facilitate attaching the battery to a chassis or printed circuit board assembly included inside the mobile system. For example, the mounting tabs may be defined during an injection molding process used to manufacture the battery housing. In particular, the mounting tabs may include an opening to receive a screw that engages with a threaded bracket provided at the chassis assembly. The traditional battery design described above has multiple deficiencies. For example, the molded plastic mounting tabs are prone to breaking if the mobile system is dropped. Additionally, broken molded plastic mounting tabs may not be recoverable or reworkable, such that a customer would need a battery replacement from a service call.

FIGS. 1-13 illustrate techniques for improving on the traditional battery design described above. In an example, the molded plastic mounting tabs are omitted and discreet tab clips are used in conjunction with snap holders secured to a chassis assembly to mount the battery within the information handling system. The tab clips and snap holders may secure a battery to the chassis assembly without the need for a screw fastening process. Tab clip materials and properties may be selected to provide compliance with the specific free fall drop specifications of each system to improve the battery durability performance and resist a fatigue degradation during micro drops. In addition, optimal physical locations of brackets may be selected based on physical dimensions of a battery. A particular battery, such as a battery with a standardized size, may be utilized in a variety of system models, thereby leveraging the costs of battery design and regulatory certification. Fewer battery models required across a product line of mobile systems may simplify component inventory management and supply chain distribution, and may reduce costs through economy of scale.

Figure 1:
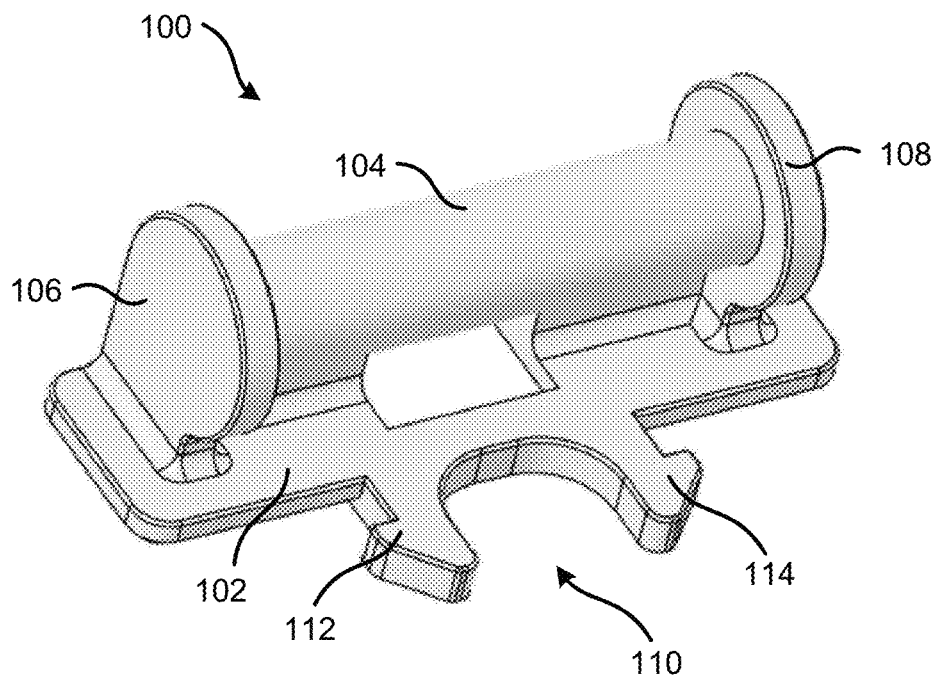
FIG. 1 is a perspective view illustrating a snap holder according to a specific embodiment of the present disclosure.

FIG. 1 is a perspective view illustrating a snap holder 100 for an information handling system according to a specific embodiment of the present disclosure. Snap holder 100 includes a main portion 102, a connection portion 104, support portions 106 and 108, and a clip portion 110. The main portion 102 may include a lip extending beyond support portions 106 and 108 to interface with a bracket as described below with respect to FIGS. 4 and 5 below. In an example, snap holder 100 may include a portion to facilitate attaching the snap holder to a bracket provided at the chassis assembly of an information handling system. For example, clip portion 110 includes hooks 112 and 114, such that clip portion may secure snap holder 100 to a bracket. In an example, each of hooks 112 and 114 include an angled portion to deflect clip portion 110 away from edges of a bracket until snap holder 100 is fully inserted into the bracket. At this point, clip portion 110 may snap fit around the bracket to secure snap holder 100 to the bracket.

Snap holder 100 may be manufactured out of any suitable hard material including, but not limited to, a hard plastic material. The particular material selected may be based on the physical requirements of snap holder 100 and the specifications of an associated information handling system. One of skill will appreciate that the illustrated design for attaching snap holder 100 to a corresponding bracket is but one example, and other designs may be utilized without departing from the present disclosure. For example, a snap holder may include a single opening to receive a screw or another type of fastener, and the corresponding bracket may include structure that provides alignment of the attached snap holder. The type of hard material and the thickness of the material used to fabricate snap holder 100 may be selected based on the product specifications of the particular information handling system utilizing the snap holder.

Figure 2:
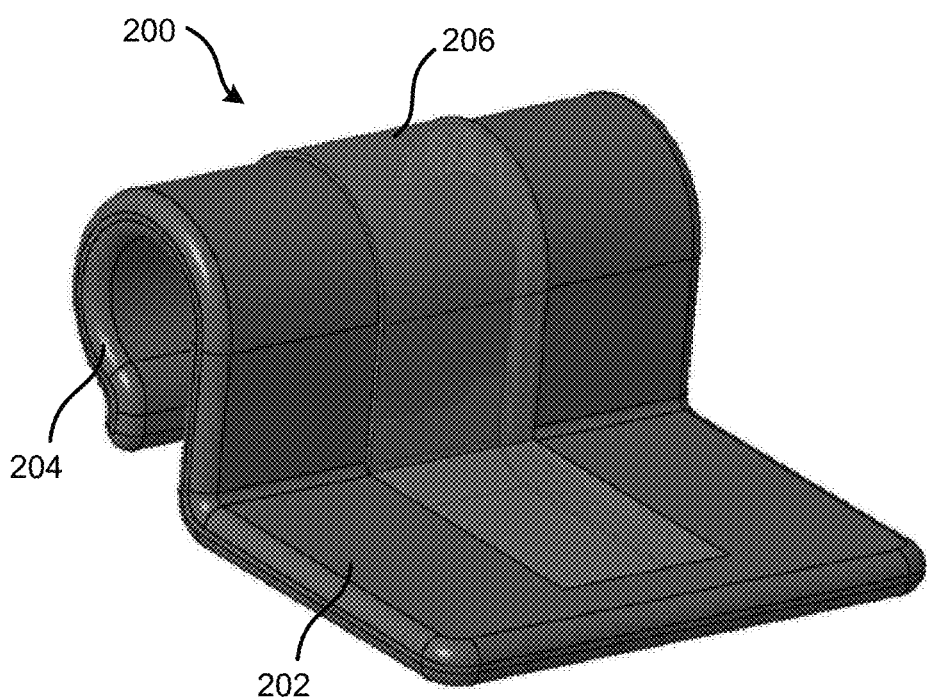
FIG. 2 is a perspective view illustrating a tab clip according to a specific embodiment of the present disclosure.

FIG. 2 shows a tab clip according to a specific embodiment of the present disclosure. Tab clip 200 includes a main portion 202 and a catch portion 204. In an example, main portion 202 will ultimately interface with a battery, and catch portion 204 may facilitate attaching the tab clip to a portion of a corresponding snap holder, such as connection portion 104 of snap holder 100 in FIG. 1. Tab clip 200 may be formed from any suitable material or combination of materials. For example, tab clip 200 may be formed from a hard material and also include a soft material portion 206.

In an example, soft material portion 206 may be slighted thicker than the remainder of tab clip 200 and may be formed from any suitable material that may absorb shock from the battery during drops of the information handling system. For example, soft material 206 may include, but is not limited to, a thermoplastic elastomer (TPE). In certain examples, tab clip 200 may be referred to as a double shot component based on being molded from both a first shot, such as the hard material, and a second shot, such as soft material 206, which is designed to add extra protection to the battery. Alternatively, snap holder 300 may be referred to as a single shot component based on the snap holder only being molded from a single material, such as a hard material. The dimensions of tab clip 200 may be selected based on the particular requirements of the information handling system. For example, the surface area of tab clip 200 or main portion 202 of the snap holder that is to interface with the battery may be increased to allow application of additional adhesive, as described below. Furthermore, fewer tab clips may be required to mount a battery at an information handling system if one or more tab clips provide additional area for contacting the battery.

Figure 3:
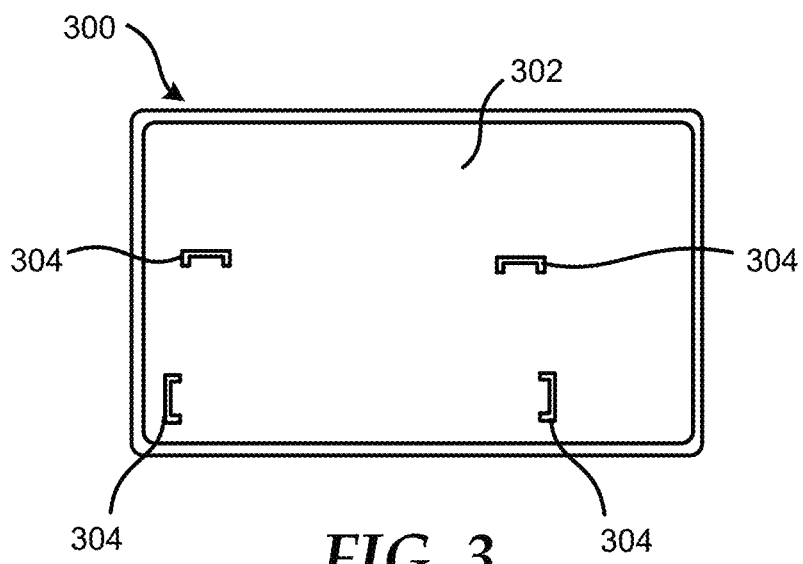
FIG. 3 is a top view illustrating multiple brackets secured to a chassis assembly of an information handling system according to a specific embodiment of the present disclosure.

FIG. 3 illustrates a portion of an information handling 300 including a chassis assembly 302 with multiple brackets 304 secured to the chassis assembly according to a specific embodiment of the present disclosure. In certain examples, information handling system 300 may include any suitable number of brackets 304 to meet a need of the information handling system and battery, such as more or less brackets than shown in FIG. 3. In an example, information handling system 300 may include any suitable number of components including, but not limited to, the components described with respect to information handling system 1400 in FIG. 14 without varying from the scope of this disclosure. In an example, a layout of brackets 304 on chassis assembly 302 may be determined by any suitable manner. For example, the layout of brackets 304 may be determined based on dimensions, such as length, width, and height, of a battery for use by information handling system 300. In an example, the battery may be a standardized size for a variety of power capabilities including, but not limited to, 42 Watts and 56 Watts.

Individual location of brackets 304 may then be determined based on the layout of the brackets 304. For example, each of brackets 304 may be placed in a particular location so that at least one of the brackets may support each corner of the battery. In different examples, brackets 304 may be aligned in one or more directions based on any suitable criteria including, but not limited to, a best way to support the battery.

Figure 4:
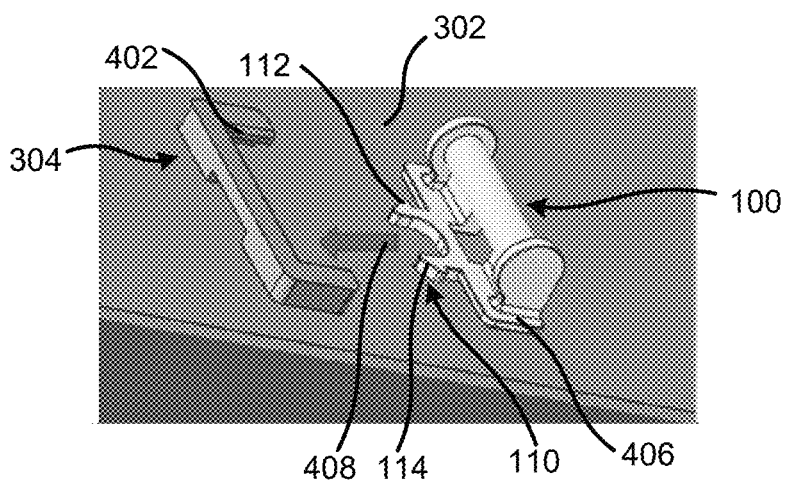
FIG. 4 is a perspective view illustrating fastening the snap holder of FIG. 1 to a bracket at a chassis assembly according to a specific embodiment of the present disclosure.

FIG. 4 illustrate snap holder 100 being fastened or secured to bracket 304 on chassis assembly 302 according to a specific embodiment of the present disclosure. One of ordinary skill would recognize that each snap holder 100 may be secured to a corresponding bracket 304 in a similar manner. However, for brevity and clarity the fastening or securing of only a single snap holder 100 to a corresponding bracket 304 will be described herein. Bracket 304 includes an overhang portion 402 and a slot 404. In an example, overhang portion 402 may extend to the inside edge of bracket 304. Slot 404 may be positioned in any suitable location to align with clip portion 110 when snap holder 100 is inserted within the bracket. In an example, snap holder 100 may include a lip portion 406 to aid in the alignment of the snap holder and bracket 304.

Figure 5:
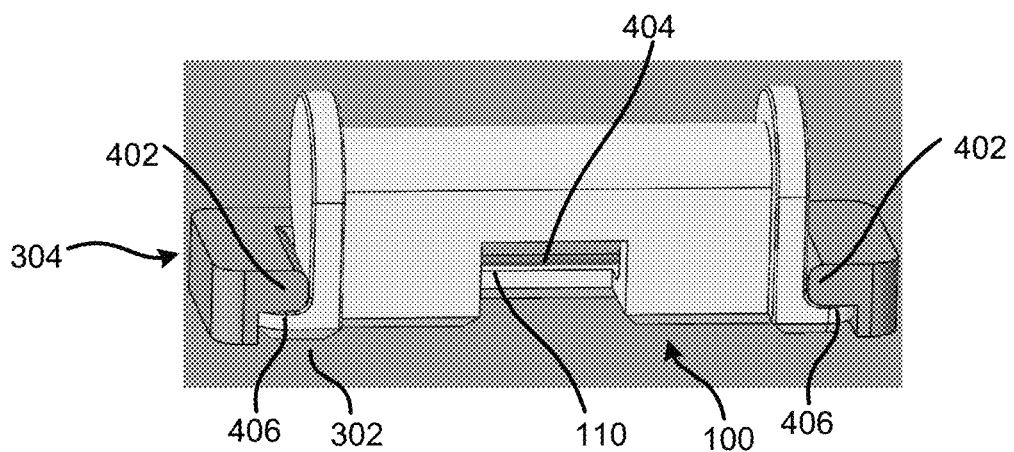
FIG. 5 is a side view of the snap holder of FIG. 1 secured to the bracket according to a specific embodiment of the present disclosure.

During installation of snap holder 100, the snap holder may be pushed toward bracket 304 in a direction indicated by arrow 408. As snap holder 100 is pushed into bracket 304, clip portion 110 may align with slot 404 and outer edges of lip portion 406 may slide under overhang portion 402. Additionally, hooks 112 and 114 may cause clip portion 110 to deflect inward and away from edges of slot 404. When snap holder 100 is fully inserted within bracket 304, hooks 112 and 114 may snap fit around a back surface of the bracket to secure the snap holder to the bracket. As shown in FIG. 5, snap holder 100 may be secured within bracket 304 based on clip portion 110 being snap fitted through slot 404 and lip portion 406 being secured between overhang portion 402 and chassis assembly 302.

Figure 6:
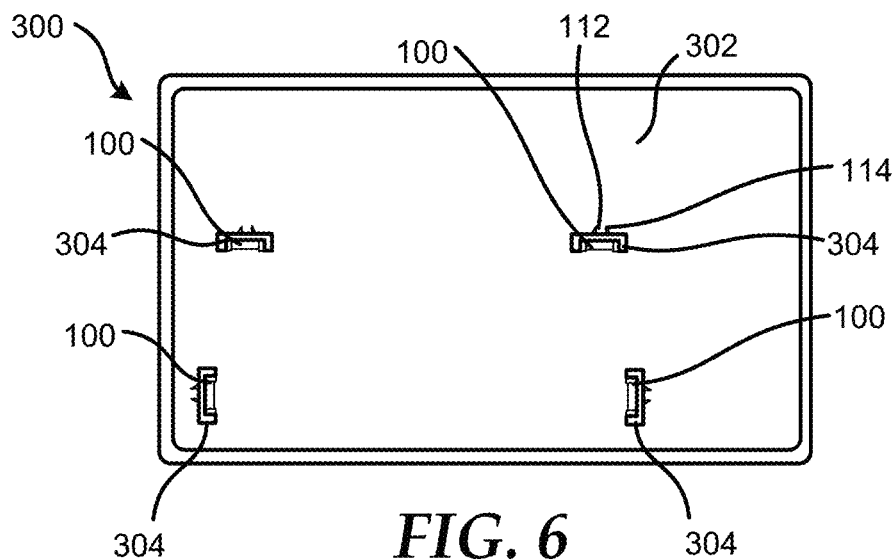
FIG. 6 is a top view illustrating multiple snap holders secured to multiple brackets of the chassis assembly according to a specific embodiment of the present disclosure.

FIG. 6 illustrates a portion of information handling system 300 including individual snap holders 100 secured to corresponding brackets 304 of chassis assembly 302 according to a specific embodiment of the present disclosure. As stated above, in response to individual snap holders 100 being fully inserted into a corresponding bracket 304, hooks 112 and 114 of the individual snap holders may snap fit around a back surface of the corresponding bracket as shown in FIG. 6. Upon each individual snap hook 100 being secured to a corresponding bracket 304, individual tab clips 200 may be secured to corresponding snap hooks as described with respect to FIG. 7.

Figure 7:
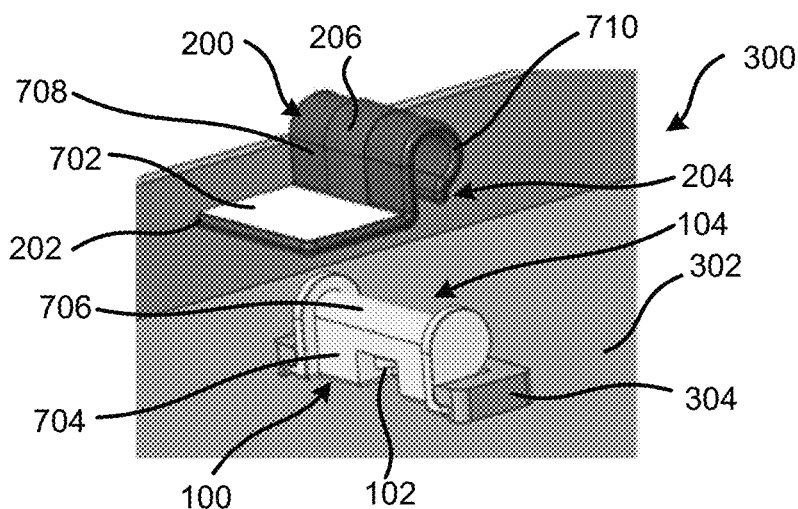
FIG. 7 is a perspective view illustrating installation of a tab clip to a snap holder according to a specific embodiment of the present disclosure.

FIG. 7 illustrates installation of tab clip 200 to snap holder 100 according to a specific embodiment of the present disclosure. One of ordinary skill would recognize that each tab clip 200 may be secured to a corresponding snap holder 100 in a similar manner. However, for brevity and clarity the snap fitting or securing of only a single tab clip 200 to a corresponding snap holder 100 will be described herein. Prior to tab clip 200 being snap fitted onto snap holder 100, an adhesive 702 may be connected to main portion 202 of the tab clip that is to contact the battery. Adhesive 702 may be applied during the manufacturing of tab clip 200, applied prior to assembly of information handling system 300, or applied to the tab clip after snap holder 100 is secured to bracket 304 of chassis assembly 302. A particular adhesive 702 may be selected based on the physical demands and specification of information handling system 300. For example, adhesive 702 may be any suitable adhesive including, but not limited to, an acrylic foam tape, a conformable double coated tape, epoxy, and cyanoacrylate. In an embodiment, a protective plastic film may be applied over adhesive 702, and removed prior to installing the battery onto tab clip 200. FIG. 7 shows fastening tab clip 200 to snap holder 100 that is secured to bracket 304 at chassis assembly 302 according to a specific embodiment of the present disclosure.

In an example, snap holder 100 may be secured to chassis assembly 302 via bracket 304 as described above. Upon securing the snap holder 100, connection portion 104 may extend above a top surface of bracket 304. In an example, connection portion 104 includes a flat portion 704 and a rounded portion 706. In certain examples, flat portion 704 may extend up from main portion 102 in a perpendicular direction from a surface of chassis assembly 302. At the top of flat portion 704, rounded portion 706 may form a surface to facilitate tab clip 200 to snap fit onto snap holder 100.

Tab clip 708 includes an extension portion 708 extending perpendicular from main portion 202, and catch portion 204 includes a flexible portion 710 to snap fit over rounded portion 706 of snap holder 100. In an example, soft material 206 may be formed through both main portion 202 and catch portion 204 of tab clip 200. Soft material 206 may provide sufficient flexibility to catch portion 204 to enable the catch portion to open as tab clip 200 is pushed down on snap holder 100, and then enable the catch portion to snap back to its original shape and secure the tab clip on the snap holder without damaging the tab clip. After each individual tab clip 200 is secured, via snap fitting, on a corresponding snap holder 100, a battery 802 may be installed and secured to the tab clips as described with respect to FIGS. 8 and 9.

Figure 8:
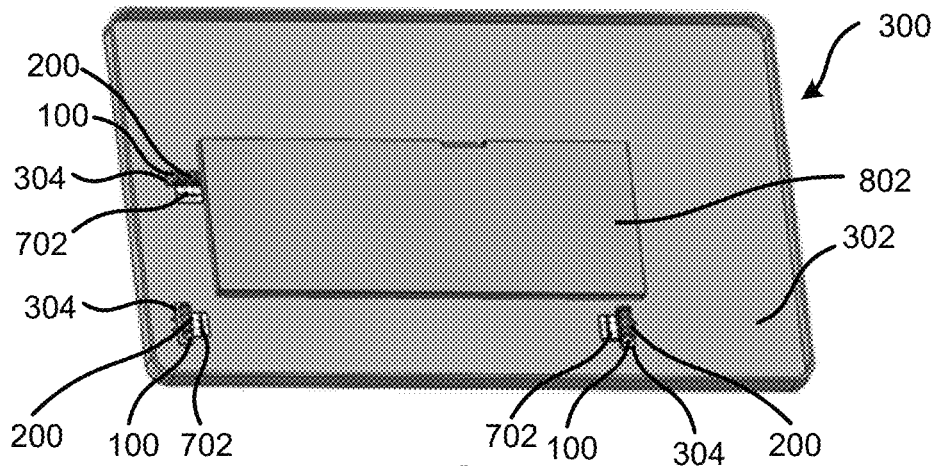
FIGS. 8 and 9 are perspective views illustrating installation of a battery device at an information handling system according to a specific embodiment of the present disclosure.
Figure 9:
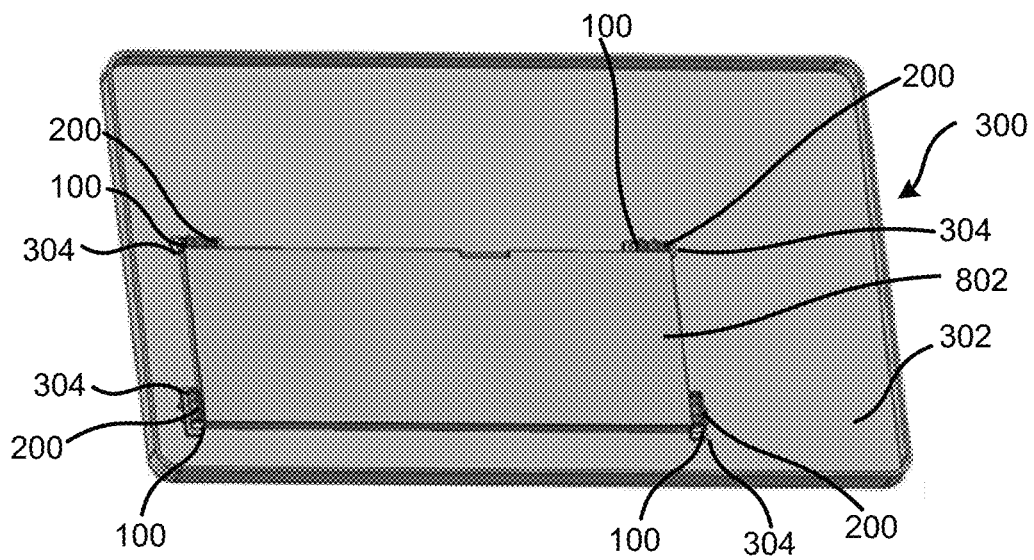

FIGS. 8 and 9 illustrate installation of battery 802 to information handling system 300 via tab clips 200 according to a specific embodiment of the present disclosure. While three tab clips 200 and associated snap holders 100 secured to a corresponding bracket 100 are shown, one of skill will appreciate that a fewer or a greater number of brackets, such as four, five, or six, may be utilized to secure battery 802 to chassis assembly 302. After adhesive 702 is applied to surfaces of each of tab clips 200, battery 802 is readied for incorporation onto chassis assembly 302 of information handling system 300. As described above, adhesive 702 may be applied to tab clips 200 before tab clips are installed at chassis assembly 302, or after the tab clips are installed. As shown in FIG. 8, battery 802 is brought into alignment with tab clips 200. Then as shown in FIG. 9, battery 802 is placed in physical communication with adhesive 702 and pressure is applied to the battery to securely affix the battery to the adhesive at each of the tab clips. Depending on the type of adhesive 702 utilized, chassis assembly 302 and attached battery 802 may be maintained at rest to allow the adhesive to cure and/or fully bind the battery to the chassis assembly.

Figure 10:
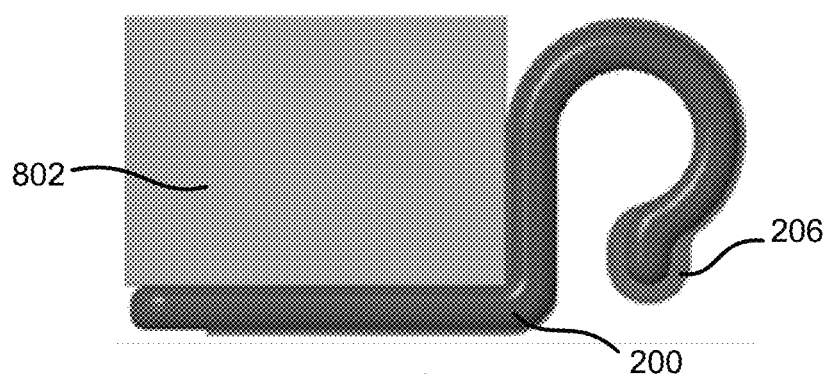
FIG. 10 is a side view illustrating a battery secured to a tab clip according to a specific embodiment of the present disclosure.

FIG. 10 illustrates battery 802 secured to tab clip 200 according to a specific embodiment of the present disclosure. In an example, battery 802 may be in contact with soft material 206 at multiple points of the battery. As shown in FIG. 10, soft material 206 may be thicker than the remainder of tab clip 200 to enable battery to contact the soft material. In an example, soft material 206 may both enhance a durability performance and resist fatigue damage of battery 802 after repeated micro drop of information handling system 300. For example, soft material 206 may absorb the repeated shock energy resulting from the micro drops to prevent the shock energy from affecting battery 802. Thus, soft material 206 will greatly improve the durability of both battery 802 and tab clip 200.

Figure 11:
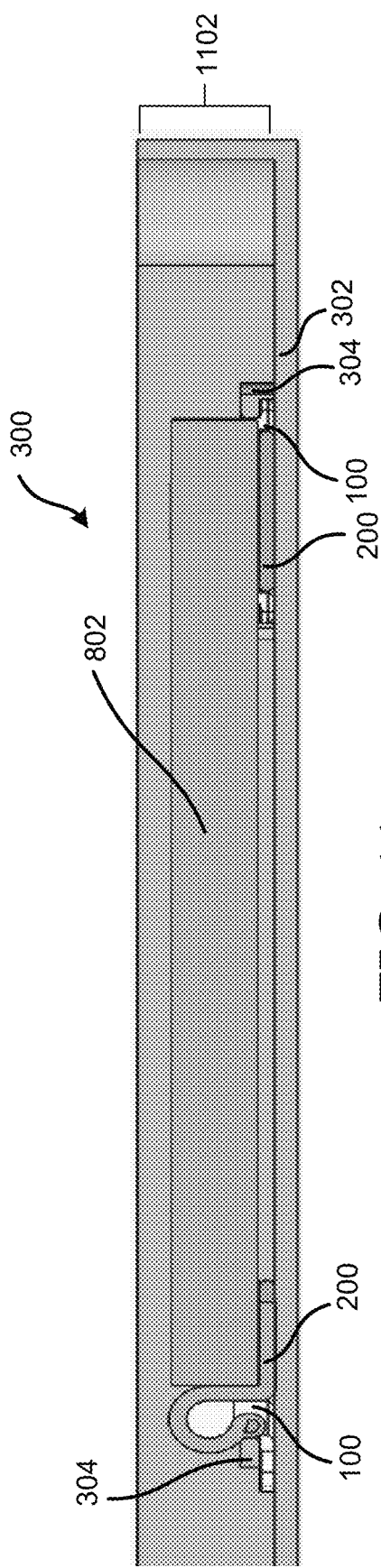
FIG. 11 is a side view illustrating a battery secured with an information handling system according to a specific embodiment of the present disclosure.

FIG. 11 illustrates battery 802 secured with information handling system 300 according to a specific embodiment of the present disclosure. In an example, dimensions, such height 1102, of information handling system 300 may be affected by the combination of the height of battery 802, the thickness of snap holders 100, and the thickness of tab clips 200. If the height of battery 802, the thickness of snap holders 100, and the thickness of tab clips 200 combine to a height greater than information handling system 300, the thickness of the tab clips may be adjusted. For example, the thickness of tab clips 200 may be reduced to enable battery 802 to be connected and supported by the tab clips without the battery exceeding height 1102 of information handling system 300.

Figure 12:
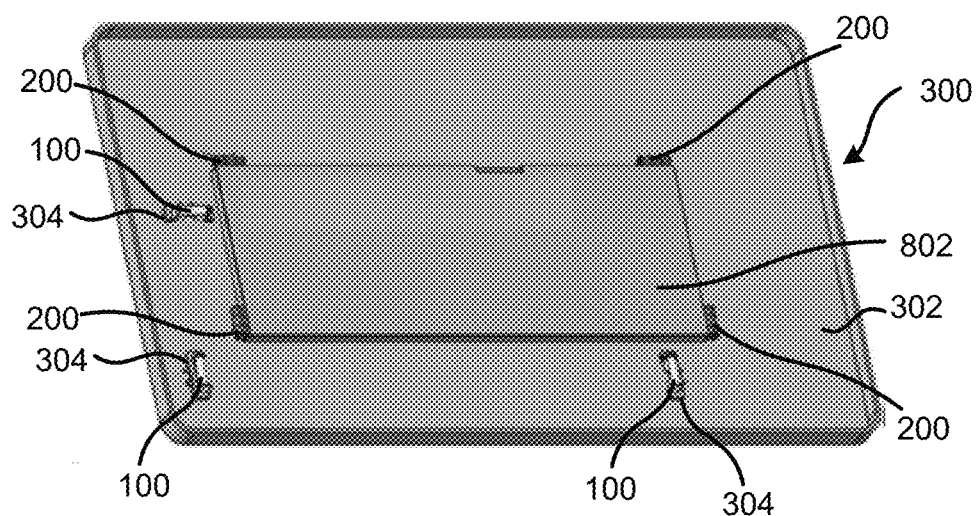
FIG. 12 is a perspective view illustrating removal of a battery at an information handling system according to a specific embodiment of the present disclosure.

FIG. 12 illustrates removal of battery 802 from information handling system 300 in the event that the battery must be replaced or removed for recycling according to a specific embodiment of the present disclosure. To remove battery 802 from chassis assembly 302, an upward force may be applied to the battery, which in turn may disengage tab clips 200 from snap holders 100 and brackets 304. In an example, tab clips 200 may remain attached to battery 802 after removal from information handling system 300. For example, adhesive 702, as shown in FIG. 7, may be strong enough to hold tab clips 200 to battery 802 while the battery is removed from information handling system 300, such that the adhesive is strong enough to overcome a force resulting from the tab clips disengaging from snap holders 100.

However, the adhesive may be not be so strong as to prevent tab clips 200 from ever being removed from battery 802. Thus, if battery 802 needs to be replaced tab clips 200 may be removed from the battery without being damaged so that the tab clips may be reused with a new battery.

Figure 13:
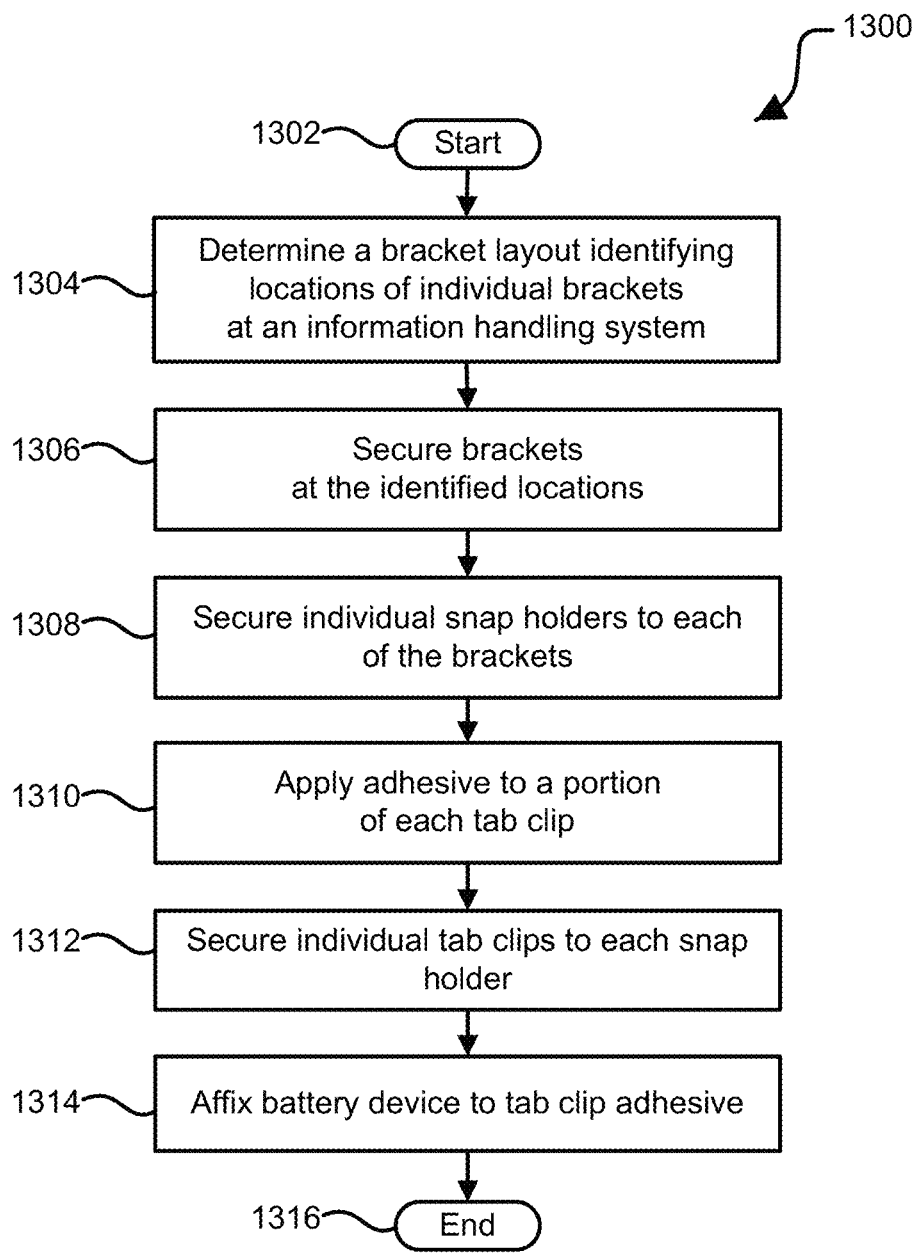
FIG. 13 is a flow diagram of a method for installing a battery at an information handling system according to a specific embodiment of the present disclosure.

FIG. 13 is a flow diagram of a method 1300 for installing a battery at an information handling system according to a specific embodiment of the present disclosure, starting at block 1302. It will be readily appreciated that not every method step set forth in this flow diagram is always necessary, and that certain steps of the methods may be combined, performed simultaneously, in a different order, or perhaps omitted, without varying from the scope of the disclosure. FIG. 13 may be employed in whole, or in part, during a manufacturing process or repair of information handling system 300 depicted in FIGS. 3-11, or any other type of system.

At block 1304, a bracket layout identifying locations of individual brackets at an information handling system is determined. In an example, the bracket layout may be determined in any suitable manner including, but not limited to, based on the physical dimensions of a battery device, such as a standardized battery device. At block 1306, brackets are secured at the identified locations. In certain examples, the brackets may be secured in any suitable manner including, but not limited to, the brackets being molded as part of a chassis assembly of the information handling system, and the brackets being permanently affixed to the chassis assembly via a bonding agent.

At block 1308, individual snap holders are secured to each bracket. In an example, the snap holders may be secured to the brackets by any suitable manner. For example, each of the snap holders may include a clip portion that may be slid through a slot of an associated bracket to snap fit the snap holder to the bracket. In an example, the clip portion may include one or more hooks that may flex away from the edges of the slot as the clip portion is slid through the slot and then the one or more hooks may snap around a back surface of the bracket to secure the snap holder to the bracket. In certain examples, the snap holders may be molded from any suitable hard material, such as a hard plastic. The hard material of the snap holders may enable the clip portion to flex enough to allow the one or more hooks to slip around the back surface of the bracket but not flex enough to enable the snap holder from being removed from the bracket without the bracket breaking.

At block 1310, an adhesive is applied to a portion of each tab clip. In an example, a particular adhesive may be selected based on the physical demands and specification of the information handling system. For example, the adhesive may include an acrylic foam tape, a conformable double coated tape, epoxy, cyanoacrylate, and the like. In an example, a protective plastic film may be applied over the adhesive, and removed prior to installing the battery onto the tab clip.

At block 1312, individual tab clips are secured to each snap holder. In an example, the tab clips may be secured to the brackets by any suitable manner. For example, a tab clip may snap fit over the snap holder to secure the tab clip to the snap holder. In certain examples, a tab clip may be may be molded from any suitable hard material, such as a hard plastic, with a portion of the tab clip formed from a soft material molded with the hard material. In an example, the soft material may be an elastomer. In certain examples, the soft material may enable a tab clip from being connected to a removed from a snap holder without the tab clip breaking.

At block 1314, the battery device is affixed to the adhesive on each of the tab clips, and the method ends at block 1316. In an example, the soft material portion of a tab clip may be placed in physical communication with the battery device. In this example, the soft material portion may absorb shock from or prevent shock from affecting the battery device during a drop of the information handling system.

Figure 14:
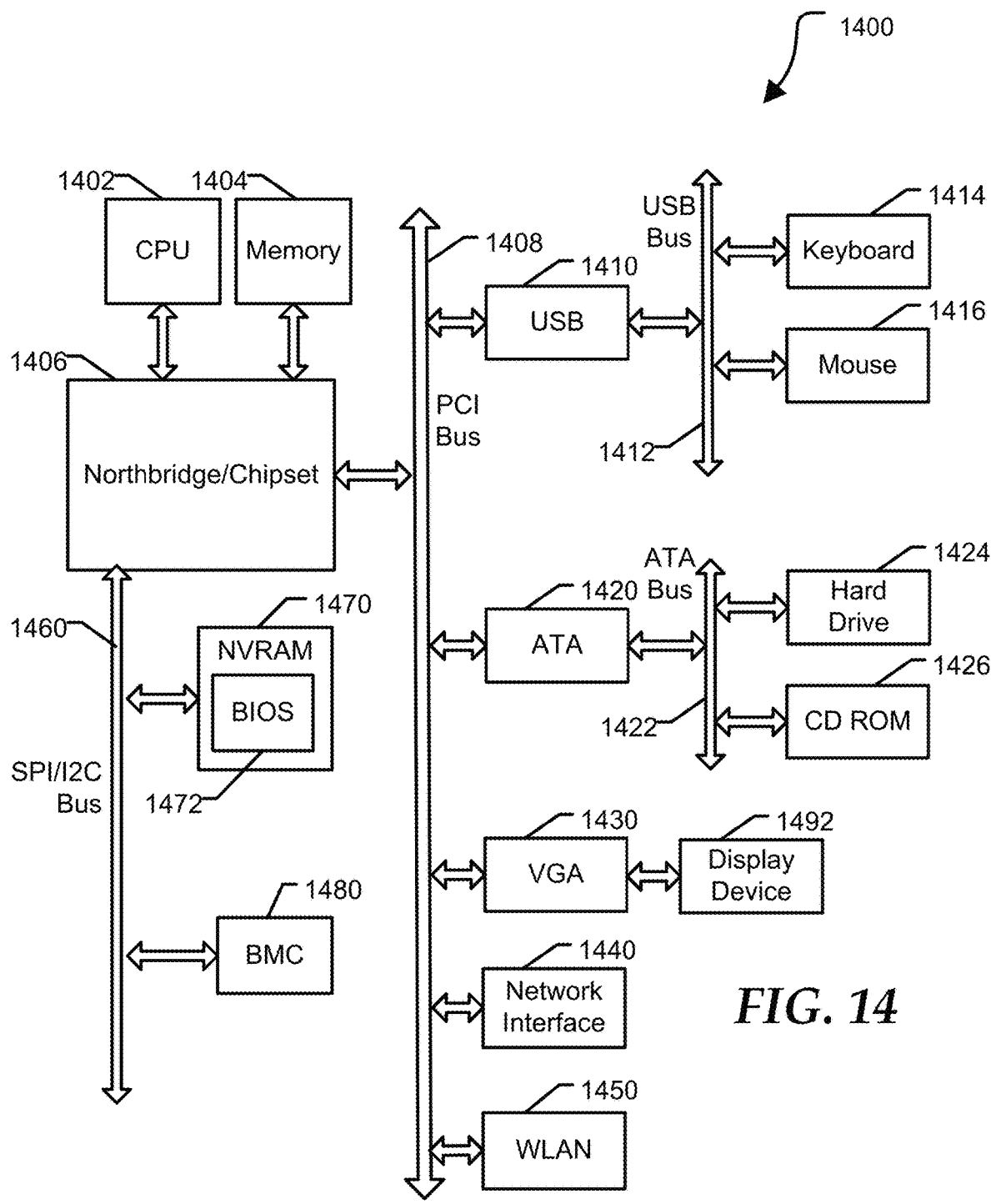
FIG. 14 is a block diagram of an information handling system according to an embodiment of the present disclosure.

FIG. 14 illustrates a general information handling system 1400 including a processor 1402, a memory 1404, a northbridge/chipset 1406, a PCI bus 1408, a universal serial bus (USB) controller 1410, a USB bus 1412, a keyboard device controller 1414, a mouse device controller 1416, a configuration an ATA bus controller 1420, an ATA bus 1422, a hard drive device controller 1424, a compact disk read only memory (CD ROM) device controller 1426, a video graphics array (VGA) device controller 1430, a network interface controller (NIC) 1440, a wireless local area network (WLAN) controller 1450, a serial peripheral interface (SPI) bus 1460, a NVRAM 1470 for storing BIOS 1472, and a baseboard management controller (BMC) 1480. In an embodiment, information handling system 1400 may include information handling system 300 of FIGS. 3-11. BMC 1480 may be referred to as a service processor or embedded controller (EC). Capabilities and functions provided by BMC 1480 may vary considerably based on the type of information handling system. For example, the term baseboard management system is often used to describe an embedded processor included at a server, while an embedded controller is more likely to be found in a consumer-level device. As disclosed herein, BMC 1480 represents a processing device different from CPU 1402, which provides various management functions for information handling system 1400. For example, an embedded controller may be responsible for power management, cooling management, and the like. An embedded controller included at a data storage system may be referred to as a storage enclosure processor.

For purpose of this disclosure information handling system 1400 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1400 may be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 1400 may include processing resources for executing machine-executable code, such as CPU 1402, a programmable logic array (PLA), an embedded device such as a System-on-a-Chip (SoC), or other control logic hardware. Information handling system 1400 may also include one or more computer-readable medium for storing machine-executable code, such as software or data.

System 1400 may include additional processors that are configured to provide localized or specific control functions, such as a battery management controller. Bus 1460 may include one or more busses, including a SPI bus, an I2C bus, a system management bus (SMBUS), a power management bus (PMBUS), and the like. BMC 1480 may be configured to provide out-of-band access to devices at information handling system 1400. As used herein, out-of-band access herein refers to operations performed prior to execution of BIOS 1472 by processor 1402 to initialize operation of system 1400.

BIOS 1472 may be referred to as a firmware image, and the term BIOS is herein used interchangeably with the term firmware image, or simply firmware. BIOS 1472 includes instructions executable by CPU 1402 to initialize and test the hardware components of system 1400, and to load a boot loader or an operating system (OS) from a mass storage device. BIOS 1472 additionally provides an abstraction layer for the hardware, such as a consistent way for application programs and operating systems to interact with the keyboard, display, and other input/output devices. When power is first applied to information handling system 1400, the system begins a sequence of initialization procedures. During the initialization sequence, also referred to as a boot sequence, components of system 1400 are configured and enabled for operation, and device drivers may be installed. Device drivers provide an interface through which other components of the system 1400 may communicate with a corresponding device.

Information handling system 1400 may include additional components and additional buses, not shown for clarity. For example, system 1400 may include multiple processor cores, audio devices, and the like. While a particular arrangement of bus technologies and interconnections is illustrated for the purpose of example, one of ordinary skilled in the art will appreciate that the techniques disclosed herein are applicable to other system architectures. System 1400 may include multiple CPUs and redundant bus controllers. One or more components may be integrated together. For example, portions of northbridge/chipset 1406 may be integrated within CPU 1402. Additional components of information handling system 1400 may include one or more storage devices that may store machine-executable code, one or more communications ports for communicating with external devices, and various input and output (I/O) devices, such as a keyboard, a mouse, and a video display. For example, device controller 1430 may provide data to a display device 1490 to visually present the information to an individual associated with information handling system 1400. An example of information handling system 1400 includes a multi-tenant chassis system where groups of tenants (users) share a common chassis, and each of the tenants has a unique set of resources assigned to them. The resources may include blade servers of the chassis, input/output (I/O) modules, Peripheral Component Interconnect-Express (PCIe) cards, storage controllers, and the like.

Information handling system 1400 may include a set of instructions that may be executed to cause the information handling system to perform any one or more of the methods or computer based functions disclosed herein. The information handling system 1400 may operate as a standalone device or may be connected to other computer systems or peripheral devices, such as by a network.

In a networked deployment, the information handling system 1400 may operate in the capacity of a server or as a client user computer in a server-client user network environment, or as a peer computer system in a peer-to-peer (or distributed) network environment. The information handling system 1400 may also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 1400 may be implemented using electronic devices that provide voice, video or data communication. Further, while a single information handling system 1400 is illustrated, the term "system" shall also be taken to include any collection of systems or sub-systems that individually or jointly execute a set, or multiple sets, of instructions to perform one or more computer functions.

The information handling system 1400 may include a disk drive unit and may include a computer-readable medium, not shown in FIG. 14, in which one or more sets of instructions, such as software, may be embedded. Further, the instructions may embody one or more of the methods or logic as described herein. In a particular embodiment, the instructions may reside completely, or at least partially, within system memory 1404 or another memory included at system 1400, and/or within the processor 1402 during execution by the information handling system 1400. The system memory 1404 and the processor 1402 also may include computer-readable media.

In an alternative embodiment, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations may include distributed processing, component/object distributed processing, and parallel processing. Alternatively, virtual computer system processing may be constructed to implement one or more of the methods or functionality as described herein.

The present disclosure contemplates a computer-readable medium that includes instructions or receives and executes instructions responsive to a propagated signal; so that a device connected to a network may communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories.

Further, the computer-readable medium may be a random access memory or other volatile re-writable memory. Additionally, the computer-readable medium may include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a chassis assembly;
   a first snap holder secured to the chassis assembly;
   a second snap holder secured to the chassis assembly;
   a first tab clip snap-fitted onto the first snap holder to secure the first tab clip to the first snap holder, the first tab clip including a first soft component portion;
   a second tab clip snap-fitted onto the first snap holder to secure the second tab clip to the second snap holder, the second tab clip including a second soft component portion;
   a battery affixed to the first and second tab clips after the tab clips are secured to the snap holders, the battery in physical communication with both the first soft component portion and the second soft component portion;
   a first adhesive affixed to the first tab clip, wherein the battery is affixed to the first tab clip via the first adhesive; and
   a second adhesive affixed to the second tab clip, wherein the battery is affixed to the second tab clip via the second adhesive.

2. The information handling system of claim 1, further comprising:
   a first bracket secured to the chassis assembly, the first bracket including a first slot; and
   a second bracket secured to the chassis assembly, the second bracket including a second slot.

3. The information handling system of claim 2, wherein the first snap holder further comprises:
   a clip portion snap-fitted within the first slot of the first bracket to secure the first snap holder to the chassis assembly.

4. The information handling system of claim 2, wherein the second snap holder further comprises:
   a clip portion snap-fitted within the second slot of the second bracket to secure the second snap holder to the chassis assembly.

5. The information handling system of claim 1, wherein the first adhesive is applied to the first tab clip before securing the first tab clip at the first snap holder, and the second adhesive is applied to the second tab clip before securing the second tab clip at the second snap holder.

6. The information handling system of claim 1, wherein each of the first and second soft component portions are formed from an elastomer component.

7. The information handling system of claim 1, wherein the first and second soft component portions absorb shock from the battery resulting from a drop of the information handling system.

8. The information handling system of claim 1, wherein the first soft component portion enables the first tab clip to be removed from the first snap holder without breaking the first tab clip.

9. A method comprising:
   determining a bracket layout at an information handling system based on physical dimensions of a battery, the bracket layout identifying locations of a plurality of brackets including first and second brackets;
   securing a first snap holder to the first bracket;
   securing a second snap holder to the second bracket;
   securing a first tab clip to the first snap holder, the first tab clip including a first soft component portion;
   securing a second tab clip to the second snap holder, the second tab clip including a second soft component portion;
   applying a first adhesive to the first tab clip after securing the first tab clip to the first snap holder;
   applying a second adhesive to the second tab clip before securing the second tab clip to the second snap holder;
   affixing the battery to the first tab clip via the first adhesive; and
   affixing the battery to the second tab clip via the second adhesive.

10. The method of claim 9, the securing of the first tab clip to the first snap holder comprises:
    snap-fitting a clip portion of the first tab clip within a first slot of the first bracket.

11. The method of claim 9, the securing of the second tab clip to the second snap holder comprises:
    snap-fitting a clip portion of the second tab clip within a second slot of the second bracket.

12. The method of claim 9, wherein each of the first and second soft component portions are formed from an elastomer component.

13. The method of claim 9, further comprising:
    absorbing, by the first and second soft component portions, shock from the battery resulting from a drop of the information handling system.

14. The method of claim 9, wherein the first soft component portion enables the first tab clip to be removed from the first snap holder without breaking the first tab clip.

15. An information handling system comprising:
    a chassis assembly;
    a first bracket secured to the chassis assembly, the first bracket including a first slot;
    a second bracket secured to the chassis assembly, the second bracket including a second slot;
    a first snap holder secured to the chassis assembly via the first bracket;
    a second snap holder secured to the chassis assembly via the second bracket;
    a first tab clip snap-fitted onto the first snap holder to secure the first tab clip to the first snap holder, the first tab clip including a first soft component portion;

a second tab clip snap-fitted onto the first snap holder to secure the second tab clip to the second snap holder, the second tab clip including a second soft component portion;

a first adhesive affixed to the first tab clip, wherein the battery is affixed to the first tab clip via the first adhesive;

a second adhesive affixed to the second tab clip, wherein the battery is affixed to the second tab clip via the second adhesive; and a battery affixed to the first and second tab clips after the tab clips are secured to the snap holders, the battery in physical communication with both the first soft component portion and the second soft component portion.

16. The information handling system of claim 15, wherein the first snap holder further comprises:

a clip portion snap-fitted within the first slot of the first bracket to secure the first snap holder to the chassis assembly.

17. The information handling system of claim 15, wherein the second snap holder further comprises:

a clip portion snap-fitted within the second slot of the second bracket to secure the second snap holder to the chassis assembly.

18. The information handling system of claim 15, wherein the first and second soft component portions absorb shock from the battery resulting from a drop of the information handling system.

* * * * *